(12) United States Patent
Kanamaru et al.

(10) Patent No.: US 9,175,380 B2
(45) Date of Patent: Nov. 3, 2015

(54) OXIDE SINTERED BODY AND SPUTTERING TARGET

(75) Inventors: Moriyoshi Kanamaru, Takasago (JP); Yuki Iwasaki, Takasago (JP); Minoru Matsui, Takasago (JP); Hiroshi Goto, Takasago (JP); Akira Nambu, Takasago (JP)

(73) Assignee: KOBELCO RESEARCH INSTITUTE, INC., Kobe-shi (JP)

( * ) Notice: Subject to any disclaimer, the term of this patent is extended or adjusted under 35 U.S.C. 154(b) by 0 days.

(21) Appl. No.: 13/981,729

(22) PCT Filed: Feb. 9, 2012

(86) PCT No.: PCT/JP2012/052980
§ 371 (c)(1),
(2), (4) Date: Jul. 25, 2013

(87) PCT Pub. No.: WO2012/108506
PCT Pub. Date: Aug. 16, 2012

(65) Prior Publication Data
US 2013/0306469 A1 Nov. 21, 2013

(30) Foreign Application Priority Data
Feb. 10, 2011 (JP) ................................ 2011-027795

(51) Int. Cl.
*C25B 11/00* (2006.01)
*C25B 13/00* (2006.01)
(Continued)

(52) U.S. Cl.
CPC ............. *C23C 14/3414* (2013.01); *C04B 35/01* (2013.01); *C04B 35/453* (2013.01);
(Continued)

(58) Field of Classification Search
CPC .................... C04B 2235/3217; C04B 35/505; C23C 14/3414; C23C 14/3407
USPC .................... 501/126; 204/298.13; 252/519.5
See application file for complete search history.

(56) References Cited

U.S. PATENT DOCUMENTS 8,304,359 B2 * 11/2012 Yano et al. .................... 501/126
2007/0215456 A1 9/2007 Abe et al.
(Continued)

FOREIGN PATENT DOCUMENTS

CN 101273153 A 9/2008
JP 2000-256061 A 9/2000
(Continued)

OTHER PUBLICATIONS

Written Opinion of the International Searching Authority Issued May 15, 2012 in PCT/JP12/052980 Filed Feb. 9, 2012.
(Continued)

*Primary Examiner* — Noah Wiese
(74) *Attorney, Agent, or Firm* — Oblon, McClelland, Maier & Neustadt, L.L.P.

(57) ABSTRACT

Provided is an oxide sintered body suitably used for producing an oxide semiconductor film for a display device, the oxide sintered body capable of forming an oxide semiconductor film exerting excellent conductivity, having high relative density and excellent in-plane uniformity, and exhibiting high carrier mobility. This oxide sintered body is obtained by combining and sintering a zinc oxide powder, a tin oxide powder, and an indium oxide powder. The oxide sintered body satisfies the following equation (1) when the oxide sintered body is subjected to X-ray diffraction, Equation (1): $[A/(A+B+C+D)]\times 100 \geq 70$. In equation (1), A represents the XRD peak intensity in the vicinity of $2\theta=34°$, B represents the XRD peak intensity in the vicinity of $2\theta=31°$, C represents the XRD peak intensity in the vicinity of $2\theta=35°$, and D represents the XRD peak intensity in the vicinity of $2\theta=26.5°$.

7 Claims, 2 Drawing Sheets

(51) Int. Cl.
  *C23C 14/34* (2006.01)
  *C04B 35/01* (2006.01)
  *C04B 35/453* (2006.01)
  *C04B 35/457* (2006.01)
  *C23C 14/08* (2006.01)

(52) U.S. Cl.
  CPC ............ *C04B35/457* (2013.01); *C23C 14/086* (2013.01); *C04B 2235/3284* (2013.01); *C04B 2235/3286* (2013.01); *C04B 2235/3293* (2013.01)

(56) References Cited

U.S. PATENT DOCUMENTS

| 2009/0197757 | A1 | 8/2009 | Fukushima |
| 2009/0308635 | A1* | 12/2009 | Yano et al. ................ 174/126.1 |
| 2010/0155717 | A1 | 6/2010 | Yano et al. |
| 2010/0170696 | A1 | 7/2010 | Yano et al. |
| 2011/0240934 | A1 | 10/2011 | Abe et al. |
| 2011/0240988 | A1 | 10/2011 | Yano et al. |
| 2011/0260121 | A1 | 10/2011 | Yano et al. |
| 2013/0001080 | A1 | 1/2013 | Abe et al. |
| 2013/0112971 | A1 | 5/2013 | Yano et al. |
| 2013/0118774 | A1 | 5/2013 | Yano et al. |

FOREIGN PATENT DOCUMENTS

| JP | 2007 63649 | 3/2007 |
| JP | 2007 277075 | 10/2007 |
| JP | 2008 63214 | 3/2008 |
| JP | 2008-66276 A | 3/2008 |
| JP | 2010 18457 | 1/2010 |
| JP | 2010 37161 | 2/2010 |
| KR | 10-2008-0049072 A | 6/2008 |
| TW | 201017885 A1 | 5/2010 |
| TW | 201029952 A1 | 8/2010 |
| WO | 2007 037191 | 4/2007 |
| WO | 2008 117810 | 10/2008 |
| WO | 2010 067571 | 6/2010 |

OTHER PUBLICATIONS

International Search Report Issued May 15, 2012 in PCT/JP12/052980 Filed Feb. 9, 2012.
U.S. Appl. No. 14/399,378, filed Nov. 6, 2014, Goto, et al.

* cited by examiner

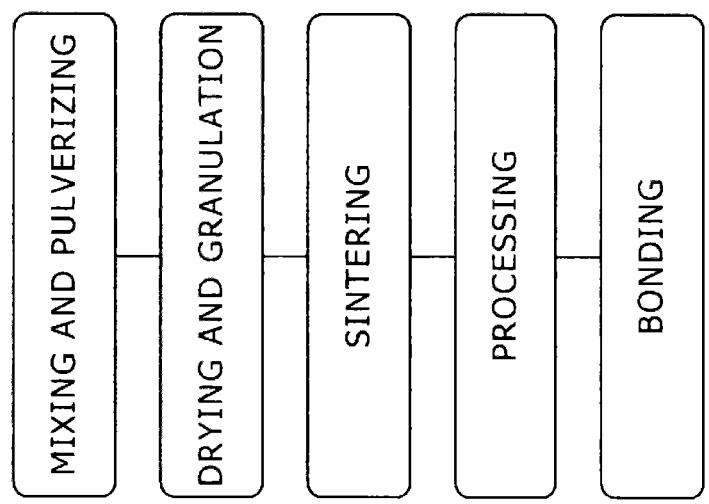

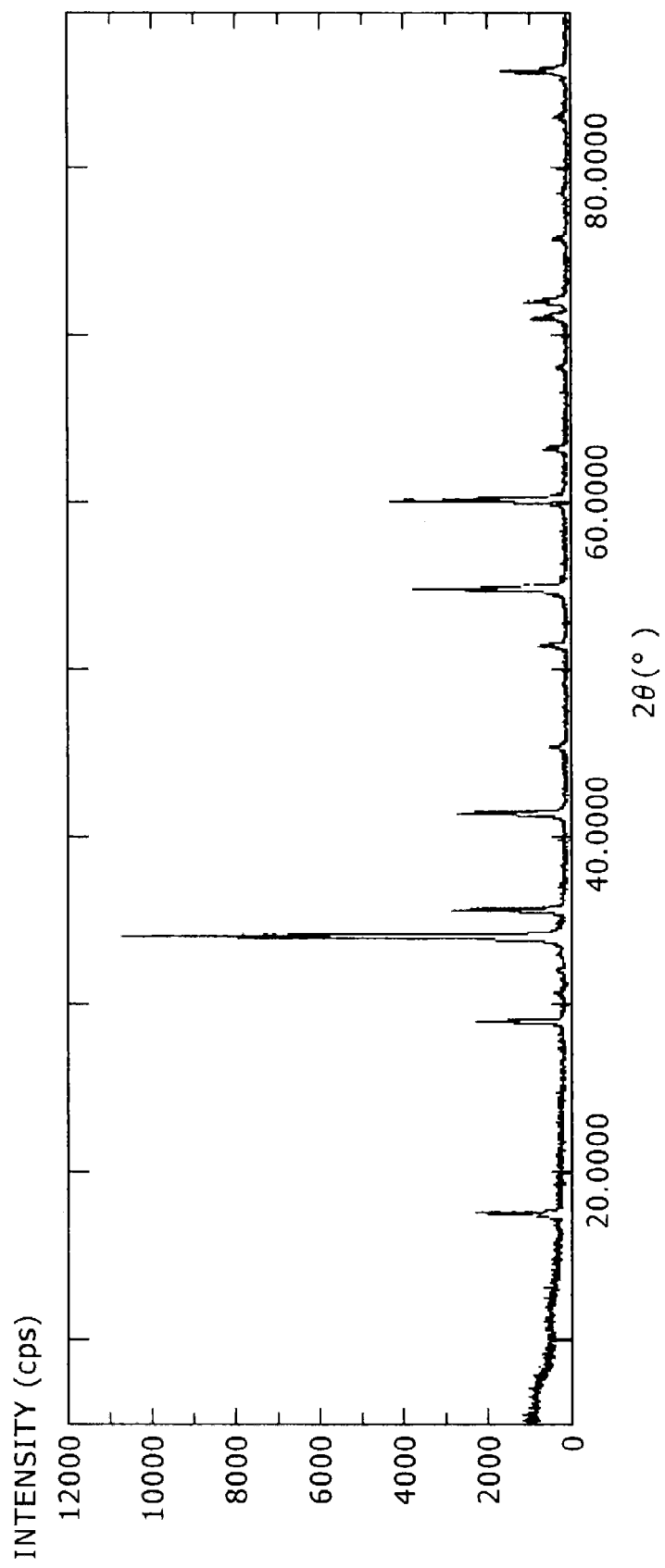

OXIDE SINTERED BODY AND SPUTTERING TARGET

TECHNICAL FIELD

The present invention relates to an oxide sintered body and a sputtering target used for depositing an oxide semiconductor thin film for a thin film transistor (TFT) by sputtering, which is used for a display device, such as a liquid crystal display or an organic EL display.

BACKGROUND ART

Amorphous (non-crystalline) oxide semiconductors used in a TFT have a high carrier mobility and a large optical bandgap as compared to generalized amorphous silicon (a-Si), and can be deposited at low temperature. Thus, the amorphous oxide semiconductors are expected to be applied to next-generation display devices required for large size, high resolution, and high-speed driving, as well as resin substrates with a low heat resistance, and the like. In formation of the above oxide semiconductor (film), a sputtering method is preferably used which involves a sputtering target made of the same material as the film. The thin film formed by the sputtering method has excellent in-plane uniformity of the composition or thickness in the direction of the film surface (in the in-plane direction) as compared to thin films formed by ion plating, vacuum evaporation coating, and electron beam evaporation. The sputtering method has an advantage that can form the thin film of the same composition as that of the sputtering target. The sputtering target is normally formed by mixing, sintering, and mechanically processing oxide powders.

The compositions of the oxide semiconductor used in the display device include, for example, In-contained amorphous oxide semiconductors, such as "In—Ga—Zn—O, In—Zn—O, or In—Sn—O (ITO)". However, the oxide semiconductor composition contains "In" as a rare metal, which might lead to the increase in material cost during mass production processes. For this reason, another oxide semiconductor appropriate for the mass production is proposed which can reduce the material cost without using the expensive element "In". The oxide semiconductor is a ZTO-based amorphous oxide semiconductor formed by adding "Sn" to "Zn". Patent literatures 1 to 4 disclose sputtering targets useful for manufacturing a ZTO-based oxide semiconductor film.

Patent literature 1 proposes a method for suppressing the occurrence of abnormal discharge or cracking during sputtering by controlling the composition of an oxide sintered body not to contain a tin-oxide phase by burning for a long time. Patent literature 2 proposes a method for suppressing the abnormal discharge during sputtering by performing two-stage processes, namely, a temporary powder burning process at a low temperature of 900 to 1300° C. and a main powder burning process to increase the density of the ZTO-based sintered body. Patent literature 3 proposes a method for improving the conductivity of an oxide sintered body and increasing the density thereof by containing a spinel $AB_2O_4$ compound in the sintered body. Patent literature 4 proposes a method for obtaining a dense ZTO-based sintered body by performing two-stage processes of a temporary power burning process performed at a low temperature of 900 to 1100° C. and a main powder burning process.

Patent literature 5 proposes a ZTO-based sputtering target having a low In content, as a sputtering target for formation of a transparent conductive film which has a low specific resistance and a high relative density even after the decrease in In content of the ITO. In general, when the In content of the ITO is decreased, the relative density of the sputtering target becomes lower, but the specific resistance of the bulk is increased. However, in the technique disclosed in Patent literature 5, a bixbyite structure represented by $In_2O_3$, and a spinel structure represented by $Zn_2SnO_4$ coexist in the target, which achieves the sputtering target having a high density and a small specific resistance, and which can suppress the abnormal discharge in the sputtering.

CITATION LIST

Patent Literature

Patent literature 1: Japanese Unexamined Patent Publication No. 2007-277075
Patent literature 2: Japanese Unexamined Patent Publication No. 2008-63214
Patent literature 3: Japanese Unexamined Patent Publication No. 2010-18457
Patent literature 4: Japanese Unexamined Patent Publication No. 2010-37161
Patent literature 5: Japanese Unexamined Patent Publication No. 2007-63649

SUMMARY OF INVENTION

Technical Problem

A sputtering target used for manufacturing an oxide semiconductor film for a display device, and an oxide sintered body as material of the sputtering target are required to have excellent conductivity and high relative density. Further, the oxide semiconductor film obtained by using the sputtering target is required to have high carrier mobility and very excellent in-plane uniformity. In particular, taking into consideration the productivity and manufacturing cost, the sputtering target is required which can be manufactured not by radio-frequency (RF) sputtering, but by direct current (DC) sputtering adapted for easy deposition at high speed. For this reason, the sputtering target is further desired to have not only low electric resistivity, but also more stable discharge (discharge stability) upon the sputtering.

The present invention has been made in view of the above circumstances, and it is an object of the present invention to provide an oxide sintered body and a sputtering target suitably used for the production of an oxide semiconductor film for a display device, and having high conductivity (low electric resistivity). It is another object of the present invention to provide a sputtering target with excellent discharge stability. It is a further object of the present invention to provide an oxide sintered body and a sputtering target that can inexpensively and stably deposit an oxide semiconductor film having high carrier mobility and excellent in-plane uniformity, preferably, by DC sputtering which enables the high-speed deposition.

Solution to Problem

An oxide sintered body according to the present invention that can solve the above problems is obtained by mixing and sintering powders of zinc oxide, tin oxide, and indium oxide. The oxide sintered body satisfies the following equation (1) when being subjected to X-ray diffraction:

$$[A/(A+B+C+D)] \times 100 \geq 70 \qquad (1),$$

where A represents the XRD peak intensity in the vicinity of 2θ=34°, B represents the XRD peak intensity in the vicinity of 2θ=31°, C represents the XRD peak intensity in the vicinity of 2θ=35°, and D represents the XRD peak intensity in the vicinity of 2θ=26.5°.

In another preferred embodiment of the invention, when [Zn], [Sn], and [In] are contents (atomic %) of metal elements contained in the oxide sintered body, a ratio of [In] to [Zn]+[Sn]+[In], and a ratio of [Zn] to [Zn]+[Sn] respectively satisfy the following formulas:

[In]/([Zn]+[Sn]+[In])=0.01 to 0.35; and

[Zn]/([Zn]+[Sn])=0.60 to 0.82.

In another preferred embodiment of the invention, the oxide sintered body has a relative density of 90% or more, and a specific resistance of 1 Ω·cm or less.

A sputtering target according to the invention that can solve the above problems is obtained using the oxide sintered body according to any one of the above embodiments, so that the sputtering target has a relative density of 90% or more, and a specific resistance of 1 Ω·cm or less.

Advantageous Effects of Invention

When crystal phases formed after sintering are controlled in areas defined by the formula [(A+B+C+D)]×100≥70 as indicated by the above formula (1), a large amount of the crystal phases having excellent discharge stability is contained in the sputtering target, which can provide the sputtering target with excellent discharge stability. The sputtering target of the invention uniformly contains the crystal phases with excellent discharge stability as described above, and thus can inexpensively and stably deposit an oxide semiconductor film having excellent in-plane uniformity and high carrier mobility, by the DC sputtering for easy deposition at high speed to thereby improve the productivity of thin films.

BRIEF DESCRIPTION OF DRAWINGS

FIG. 1 is a diagram showing basic steps for manufacturing an oxide sintered body and a sputtering target according to the invention.

FIG. 2 is a diagram showing the result of X-ray diffraction of the oxide sintered body of a specimen No. 1 of Table 1 in the invention.

DESCRIPTION OF EMBODIMENTS

The inventors have studied about oxide sintered bodies obtained by mixing and sintering powders of zinc oxide, tin oxide, and indium oxide so as to provide the oxide sintered body for a sputtering target having high conductivity (low specific resistance) and high relative density which can be applied to DC sputtering, which has excellent discharge stability in use as a sputtering target, and which is suitably used for depositing an oxide semiconductor thin film having excellent in-plane uniformity and high carrier mobility. As a result, the predetermined object is found to be achieved by the oxide sintered body which is controlled to satisfy the above-mentioned relationship (1) upon being subjected to X-ray diffraction when A represents the XRD peak intensity in the vicinity of 2θ=34°, B represents the XRD peak intensity in the vicinity of 2θ=31°, C represents the XRD peak intensity in the vicinity of 2θ=35°, and D represents the XRD peak intensity in the vicinity of 2θ=26.5°.

The phrase "excellent discharge stability (stability in sputtering)" as used in the present specification means that there is very little abnormal discharge, such as arcing, in sputtering. Specifically, when measuring the number of arcing by methods of examples to be described later, the case where the number of arching is three or less is evaluated as the state with the "excellent discharge stability".

The phrase "excellent in-plane uniformity" as used in the present specification means that an oxide thin film deposited has the uniform sheet resistance in the in-plane direction. That is, this means that an in-plane thickness distribution is uniform, and an in-plane composition is also uniform. Specifically, when the sheet resistance of the thin film is measured in 9 points of the same surface by a method represented in the examples to be described later, all sheet resistances in the respective points are controlled within a range of (average sheet resistance of 9 points)±3%, which is evaluated as the "excellent in-plane uniformity".

As to the composition of the above oxide sintered body (sputtering target), $In_2O_3$ is added in a predetermined amount to the oxide sintered body for the ZTO-based oxide semiconductor formed using ZnO and $SnO_2$ as raw material, which improves the relative density of the oxide sintered body and decreases the specific resistance thereof. As a result, it is found that the stable DC discharge can be continuously obtained. Further, the TFT having the oxide semiconductor thin film deposited using the above sputtering target can also be found to have very high-level characteristics, specifically, a carrier density of 15 $cm^2$/Vs or more.

Specifically, when [Zn], [Sn], and [In] are respectively the contents of metal elements (atomic %) contained in the oxide sintered body, preferably, the ratio of [In] to [Zn]+[Sn]+[In] (that is, the [In] ratio) is in a range of 0.01 to 0.35, that is, [In] ratio=0.01 to 0.35, and the ratio of [Zn] to [Zn]+[Sn] (that is, the [Zn] ratio) is in a range of 0.60 to 0.82, that is, [Zn] ratio=0.60 to 0.82. More preferably, [In] ratio=0.10 to 0.30, and [Zn] ratio=0.60 to 0.80. In the above Patent literature 5, in order to set the composition of the sputtering target appropriate for deposition of the transparent conductive film, the [In] ratio is set more than the above range, and the [Zn] ratio is set lower than the above range. The preferable composition ratio disclosed in Patent literature 5 described above differs from that of the present invention that can provide the oxide sintered body and sputtering target appropriate for the deposition of the oxide semiconductor thin film.

That is, the oxide sintered body of the invention satisfies the following equation (1) when being subjected to X-ray diffraction under the conditions to be described later:

$$[A/(A+B+C+D)] \times 100 \geq 70 \quad (1),$$

where A represents the XRD peak intensity in the vicinity of 2θ=34°, B represents the XRD peak intensity in the vicinity of 2θ=31°, C represents the XRD peak intensity in the vicinity of 2θ=35°, and D represents the XRD peak intensity in the vicinity of 2θ=26.5°.

The term "in the vicinity of 2θ=34°" as used herein intends to cover the range of about 34°±0.5°. In the above peak position, a crystal phase corresponding to $Zn_4Sn_2InO_{9.5}$ is supposed to exist.

The term "in the vicinity of 2θ=31°" as used herein intends to cover the range of about 31°±1°. In the above peak position, a crystal phase corresponding to $ZnSnIn_xO_{3+1.5x}$ is supposed to exist.

The term "in the vicinity of 2θ=35°" as used herein intends to cover the range of about 35°±0.4°. In the above peak position, a crystal phase corresponding to $Zn_yIn_2O_{y+3}$ is supposed to exist.

The term "in the vicinity of 2ν=26.5°" as used herein intends to cover the range of about 26.5°±1°. In the above peak position, a crystal phase corresponding to $SnO_2$ is supposed to exist.

The conditions for X-ray diffraction in the invention are as follows:

Analyzer: "X-ray diffraction device RINT-1500" manufactured by Rigaku Corporation Analysis Conditions:

Target: Cu

Monochromating: the use of monochromate (Kα)

Target Output: 40 kV-200 mA (Continuous Measurement) θ/2θ scanning

Slit: Divergence ½°, Scattering ½°, Receiving 0.15 mm

Monochromator Receiving Slit: 0.6 mm

Scanning Speed: 2°/min

Sampling Width: 0.02°

Measurement Angle (2θ): 5 to 90°

In one aspect of the invention, as mentioned above, the above relationship (1) is set from the viewpoint of improving the discharge stability in sputtering and the in-plane uniformity of the oxide semiconductor film formed by the sputtering. The satisfaction of the above relationship (1), that is, $[A/(A+B+C+D)]\times 100 \geq 70$ means that the crystal phase corresponding to $Zn_4Sn_2InO_{9.5}$ mainly exists in the oxide sintered body.

For the ratio of $[A/(A+B+C+D)]\times 100$ of less than 70, the discharge stability in the sputtering and the in-plane uniformity of the oxide semiconductor film formed by the sputtering are degraded. From the viewpoint of the relationship with the above characteristics, the ratio of $[A/(A+B+C+D)]\times 100$ should be as many as possible, and most preferably 100.

Now, a preferable composition ratio (atomic ratio) of metal elements contained in the oxide sintered body of the invention will be described. In the following, the ratio of [In] to [Zn]+[Sn]+[In] will be referred to as the [In] ratio, and the ratio of [Zn] to [Zn]+[Sn] will be referred to as the [Zn] ratio as mentioned above.

The [In] ratio is preferably in a range of 0.01 to 0.35. For the [In] ratio of less than 0.01, the relative density of the oxide sintered body cannot be improved and the specific resistance of the oxide sintered body cannot be reduced, which leads to a decrease in carrier mobility of the thin film after the deposition. More preferably, the [In] ratio is 0.10 or more. In contrast, for the [In] ratio exceeding 0.35, the TFT switching characteristics of the thin film are degraded. The [In] ratio is more preferably 0.30 or less, and most preferably 0.25 or less.

The [Zn] ratio is preferably in a range of 0.60 to 0.82. For the [Zn] ratio of less than 0.60, the micro-workability of the thin film formed by the sputtering is degraded, which is likely to cause an etching residue. In contrast, for the [Zn] exceeding 0.82, the deposited thin film reduces the resistance to chemicals, and thus cannot achieve the high-accuracy processing because of the high dissolution rate of components of the thin film into an acid in the microfabrication. The [Zn] ratio is more preferably in a range of 0.60 to 0.80.

The oxide sintered body of the invention satisfies the following characteristics: the relative density of 90% or more, and the specific resistance of 1 Ω·cm or less.

(Relative Density of 90% or More)

The oxide sintered body of the invention has a very high relative density, preferably 90% or more, and more preferably 95% or more. The high relative density can prevent the occurrence of cracking or nodules during sputtering, and can advantageously continuously keep the discharge stable until the target life.

(Specific Resistance of 1 Ω·cm or Less)

The oxide sintered body of the invention has a small specific resistance, preferably, of 1 Ω·cm or less, and more preferably, of 0.1 Ω·cm or less. This setting allows the deposition by the DC sputtering method of plasma discharge using a DC power supply. As a result, the physical vapor deposition (sputtering) using a sputtering target can be effectively performed on a production line of the display devices.

Next, a method for manufacturing the oxide sintered body according to the invention will be described below.

The oxide sintered body of the invention is obtained by mixing and sintering powders of zinc oxide, tin oxide, and indium oxide. Basic steps from the powders of raw material up to the sputtering target are shown in FIG. 1. FIG. 1 illustrates the basic steps in which an oxide sintered body obtained by mixing and pulverizing, drying and granulation, molding (not shown), and sintering powders of oxides is further processed and bonded to produce a sputtering target. Although not shown in FIG. 1, after the sintering, heat treatment may be performed if necessary. In the invention, the sintering conditions are appropriately controlled in the sintering step among the above steps as will be described later in detail. Other steps are not limited to specific ones, and can be performed by normal processes appropriately selected. Now, the respective steps will be described below, but the invention is not limited thereto.

First, zinc oxide powder, tin oxide powder, and indium oxide powder are blended at a predetermined blending ratio, mixed, and pulverized. The purity of each of the raw material powders used is preferably about 99.99% or more. Even the presence of a small amount of impurity element might degrade the semiconductor properties of the oxide semiconductor film. The blending ratio of the raw material powders is preferably controlled such that the ratio of each of Zn, Sn, and In is within the above corresponding range.

The mixing and pulverizing processes are preferably performed using a pot mill, into which the raw material powders are charged with water. Balls and beads used in the steps are preferably formed of, for example, nylon, alumina, zirconia, and the like.

Next, the mixed powder obtained in the above steps is dried and granulated, and then molded. When the crystal phases after the sintering are controlled to exist in the area represented by the above formula (1): $[A/(A+B+C+D)]\times 100 \geq 70$, the content of the crystal phase corresponding to A and having a high melting point is increased, which makes it difficult to ensure the sintering properties. Thus, in order to increase the density of the oxide sintered body, it is necessary to sinter while pressing, and to mold the powder. Specifically, a method is proposed which involves charging the dried and granulated powder, for example, into a graphitic die having a predetermined size, and sintering the powder at a temperature of about 1000 to 1100° C. while pressing the powder by a graphitic stick or the like, in molding. In this way, the oxide sintered body of the invention can be obtained by pressing and sintering the powder in the graphitic die.

After obtaining the oxide sintered body in the way described above, the steps of processing and bonding by normal methods can produce the sputtering target of the invention. The thus-obtained sputtering target also has very good relative density and specific resistance, like the oxide sintered body. A preferable relative density of the sputtering target is about 90% or more, and a preferable specific resistance of the sputtering target is about 1 Ω·cm or less.

EXAMPLES

Now, the present invention will be more specifically described with reference to examples below. However, the invention is not limited to the following examples, and various changes can be appropriately made to the examples so as to comply with the spirit of the invention, and any one of the examples can fall within the technical scope of the invention.

Zinc oxide powder having a purity of 99.99%, tin oxide powder having a purity of 99.99%, and indium oxide powder having a purity of 99.99% were blended at each of ratios shown in Table 1, and mixed by a nylon ball mill for 20 hours. Then, the mixed powders obtained in the above process were dried and granulated, and thereafter charged into the graphitic die and sintered at the temperature shown in Table 1 while pressing at 30 MPa with the graphitic stick.

Various oxide sintered bodies thus-obtained were subjected to X-ray diffraction analysis under the above-mentioned conditions, and the intensities A to D of the XRD peaks were measured, which determined the ratio of $[A/(A+B+C+D)] \times 100$ forming the formula (1). Further, the relative density of the oxide sintered body was measured by the Archimedes method, and the specific resistance thereof was measured by a four-probe method.

Further, the above oxide sintered body was processed into a piece having φ4 inch×5 mmt, which was bonded to a backing plate to produce a sputtering target. The thus-obtained sputtering target was mounted to sputtering equipment, and was then used to deposit an oxide semiconductor film over a glass substrate (having a size of 100 mm×100 mm×0.50 mm) by a DC (direct current) magnetron sputtering. Sputtering conditions were as follows: DC sputtering power of 150 W, Ar/0.1 volume % $O_2$ atmosphere, and pressure of 0.8 mTorr.

The thin film deposited under the sputtering conditions was used to produce a thin film transistor having a channel length of 10 μm, and a channel width of 100 μm. Then, the carrier mobility of the transistor was measured.

(Evaluation of In-plane Uniformity)

A specimen having the above oxide semiconductor film formed thereon was used to measure the sheet resistance of each specimen in any 9 points of the same surface (having a size of 100 mm×100 mm×0.50 mm) of the film on the glass substrate. Specifically, the sheet resistance was measured by the four-probe method, and evaluated based on the reference below.

Excellent (excellent film uniformity): The sheet resistances of all 9 points of the film are controlled within a range of (average sheet resistance of 9 points)±3%;

Acceptable (acceptable film uniformity): The sheet resistances of one to three points among 9 points exceed the range of (average sheet resistance of 9 points)±3%; and Unacceptable (unacceptable film uniformity): The sheet resistances of not less than 4 points and not more than 8 points among 9 points exceed the range of (average sheet resistance of 9 points)±3%.

(Evaluation of Discharge Stability Based on Occurrence of Arching)

The number of arching occurring in each specimen upon the above DC magnetron sputtering was counted by an arc monitor connected to an electric circuit of the sputtering device. Specifically, first pre-sputtering was performed for 10 minutes (whose conditions are the same as those of the above sputtering, that is, DC sputtering power of 150 W, Ar/0.1 volume % $O_2$ atmosphere, and pressure of 0.8 mTorr). Then, the above-mentioned DC magnetron sputtering was performed for 10 minutes. At that time, the number of occurrence of arching in each specimen was measured. The discharge stability (sputtering stability) of each specimen was evaluated based on the reference below.

Unacceptable (defective sputtering state): The number of occurrence of arching is 10 or more;

Acceptable (acceptable sputtering state): The number of occurrence of arching is in a range of 4 to 9; and Excellent (excellent sputtering state): The number of occurrence of arching is 3 or less.

The results of these measurements are shown in Table 1. The result of X-ray diffraction analysis of the specimen No. 1 shown in Table 1 is shown in FIG. 2.

TABLE 1

| No. | [In] | [Zn] | [Sn] | [In] ratio | [Zn] ratio | [Sn] ratio | Sintering temperature (° C.) | [A/(A+B+C+D)] × 100 | Relative density (%) | Mobility (cm²/Vs) | Specific resistance (Ω·cm) | In-plan uniformity | Sputtering stability |
|---|---|---|---|---|---|---|---|---|---|---|---|---|---|
| 1 | 10 | 45 | 45 | 0.1 | 0.50 | 0.50 | 1050 | 60.6 | 98.9 | 15 or more | $16 \times 10^{-3}$ | Acceptable | Acceptable |
| 2 | 10 | 60 | 30 | 0.1 | 0.67 | 0.33 | 1050 | 88.2 | 99.8 | 15 or more | $3.8 \times 10^{-3}$ | Excellent | Excellent |
| 3 | 10 | 72 | 18 | 0.1 | 0.80 | 0.20 | 1050 | 85.3 | 99.3 | 15 or more | $1.8 \times 10^{-3}$ | Excellent | Excellent |
| 4 | 10 | 75 | 15 | 0.1 | 0.83 | 0.17 | 1050 | 35.4 | 99.5 | 10 or less | $2 \times 10^{-3}$ | Acceptable | Acceptable |
| 5 | 20 | 40 | 40 | 0.2 | 0.50 | 0.50 | 1050 | 46.7 | 99.0 | 15 or more | $8.7 \times 10^{-3}$ | Acceptable | Acceptable |
| 6 | 20 | 53.3 | 26.7 | 0.2 | 0.67 | 0.33 | 1050 | 86.5 | 99.1 | 15 or more | $3.7 \times 10^{-3}$ | Excellent | Excellent |
| 7 | 20 | 64 | 16 | 0.2 | 0.80 | 0.20 | 1050 | 74.9 | 99.7 | 15 or more | $1.9 \times 10^{-3}$ | Excellent | Excellent |
| 8 | 20 | 66.7 | 13.3 | 0.2 | 0.83 | 0.17 | 1050 | 37.8 | 98.8 | 10 or less | $2.5 \times 10^{-3}$ | Acceptable | Acceptable |
| 9 | 30 | 35 | 35 | 0.3 | 0.50 | 0.50 | 1100 | 37.4 | 99.9 | 15 or more | $3.2 \times 10^{-3}$ | Acceptable | Acceptable |
| 10 | 4 | 48 | 48 | 0.04 | 0.50 | 0.50 | 1000 | 54.4 | 98.9 | 15 or more | $33 \times 10^{-3}$ | Acceptable | Acceptable |
| 11 | 34 | 33 | 33 | 0.34 | 0.50 | 0.50 | 1100 | 9.5 | 99.4 | 15 or more | $2.2 \times 10^{-3}$ | Acceptable | Acceptable |

* [In] ratio = [In]/([In]+ [Zn]+ [Sn])
* [Zn] ratio = [Zn]/([Zn]+ [Sn]), [Sn] ratio = [Sn]/([Zn]+ [Sn])

Referring to Table 1, the following can be considered.

Specimens No. 2, 3, 6, and 7 of Table 1 are examples of the invention which had the ratio of $[A/(A+B+C+D)] \times 100$ of 70 or more to satisfy the relationship (1) defined by the invention. The sputtering target of each specimen had the relative density of 90% or more, and the specific resistance of 0.1 Ω·cm or less with excellent sputtering stability. The thin film deposited using the sputtering target of each specimen had a carrier mobility of 15 cm²/Vs or more with excellent in-plane uniformity.

In contrast, specimens No. 1, 4, 5, and 8 to 11 of Table 1 are comparative examples which had the above ratio of $[A/(A+B+C+D)] \times 100$ of less than 70 and which did not satisfy the relationship (1) defined by the invention. In particular, when focusing on the in-plane uniformity and the sputtering stability, the comparative examples are inferior to the above examples of the invention in these characteristics. Some of the comparative examples (specimens No. 4 and 8) had the carrier mobility of less than 15 cm²/Vs.

As can be seen from the above results of experiments, the sputtering targets obtained by using the oxide sintered bodies satisfying the requirements defined by the invention and the preferable composition ratio of metal elements contained in the oxide sintered body of the invention have not only the high relative density and low specific resistance, but also the excellent stability in sputtering. The thin film obtained by using the above sputtering target has the high carrier mobility and excellent in-plane uniformity, and thus becomes very useful as the oxide semiconductor thin film.

The invention claimed is:

1. An oxide sintered body, produced by a process comprising mixing and sintering powders of zinc oxide, tin oxide, and indium oxide,
    wherein the oxide sintered body satisfies following formula (1) when subjected to X-ray diffraction:

$$[A/(A+B+C+D)] \times 100 \geq 70 \quad (1),$$

where A represents a XRD peak intensity in a vicinity of $2\theta=34°$,
    B represents a XRD peak intensity in a vicinity of $2\theta=31°$,
    C represents a XRD peak intensity at $2\theta=36°$, and
    D represents a XRD peak intensity in a vicinity of $2\theta=26.5°$.

2. The oxide sintered body according to claim 1, wherein when [Zn], [Sn], and [In] represent contents of metal elements in the oxide sintered body, a ratio of [In] to [Zn]+[Sn]+[In], and a ratio of [Zn] to [Zn]+[Sn], respectively satisfy formulas:

[In]/([Zn]+[Sn]+[In])=from 0.01 to 0.35; and

[Zn]/([Zn]+[Sn])=from 0.60 to 0.82.

3. The oxide sintered body according to claim 1, wherein the oxide sintered body has a relative density of 90% or more, and a specific resistance of 1 Ω·cm or less.

4. A sputtering target obtained using produced with the oxide sintered body according to claim 1, wherein the sputtering target has a relative density of 90% or more, and a specific resistance of 1 Ω·cm or less.

5. The oxide sintered body according to claim 2, wherein the oxide sintered body has a relative density of 90% or more, and a specific resistance of 1 Ω·cm or less.

6. A sputtering target produced with the oxide sintered body according to claim 2, wherein the sputtering target has a relative density of 90% or more, and a specific resistance of 1 Ω·cm or less.

7. A sputtering target produced with the oxide sintered body according to claim 3, wherein the sputtering target has a relative density of 90% or more, and a specific resistance of 1 Ω·cm or less.

* * * * *